United States Patent
Chen

(10) Patent No.: US 7,485,925 B2
(45) Date of Patent: Feb. 3, 2009

(54) HIGH VOLTAGE METAL OXIDE SEMICONDUCTOR TRANSISTOR AND FABRICATING METHOD THEREOF

(75) Inventor: Hwi-Huang Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 313 days.

(21) Appl. No.: 11/162,152

(22) Filed: Aug. 30, 2005

(65) Prior Publication Data

US 2007/0045675 A1    Mar. 1, 2007

(51) Int. Cl.
 *H01L 29/76* (2006.01)
(52) U.S. Cl. .................. 257/341; 257/336; 257/401; 257/E29.256; 438/301; 438/527
(58) Field of Classification Search .................. 257/336, 257/408, 339, 401, E29.256, E29.066, E29.027, 257/341
See application file for complete search history.

(56) References Cited

U.S. PATENT DOCUMENTS 7,151,296 B2 *  12/2006  Wu et al. ................... 257/328

2005/0104098 A1 *  5/2005  Yasuoka et al. ............. 257/288
2005/0282321 A1 *  12/2005  Hsu ........................... 438/197

* cited by examiner

*Primary Examiner*—Jerome Jackson, Jr.
*Assistant Examiner*—Jose R Diaz
(74) *Attorney, Agent, or Firm*—Jianq Chyun IP Office

(57) ABSTRACT

A high voltage MOS transistor including a substrate, a well, a gate insulation layer, a gate, two drift regions, a channel region, a source/drain region and an isolation structure is provided. The well is disposed in the substrate and the gate insulation layer is disposed over the substrate. The gate is disposed over the gate insulation layer. The two drift regions are in the well at two sides of the gate and the width of the gate is smaller than or equal to that of the drift regions. The channel region is disposed between the drift regions and the width of the channel region is greater than that of the drift regions. The source/drain regions are formed within the drift regions. The isolation structure is disposed inside the drift regions between the source/drain region and the channel region. The drift regions enclose the source/drain regions and the isolation structure.

15 Claims, 2 Drawing Sheets

HIGH VOLTAGE METAL OXIDE SEMICONDUCTOR TRANSISTOR AND FABRICATING METHOD THEREOF

BACKGROUND OF THE INVENTION

1. Field of the Invention

The present invention relates to a metal-oxide-semiconductor (MOS) transistor and fabricating method thereof. More particularly, the present invention relates to a high voltage MOS transistor and fabricating method thereof.

2. Description of the Related Art

High voltage metal-oxide-semiconductor (MOS) transistors are widely used in electronic products that require high voltage, such as flash memory or the control circuit of a flat panel display. Since the high voltage MOS transistor must operate at a high voltage without any signs of electrical breakdown, the breakdown voltage of a high voltage MOS transistor is higher than most conventional devices.

FIG. 1 is a top view of a conventional high voltage metal-oxide-semiconductor (MOS) transistor. As shown in FIG. 1, the high voltage MOS transistor 100 mainly comprises a substrate 100, a well 110, two drift regions 120a/120b, two source/drain regions 140a/140b, a channel region 130, a gate 150 and a gate insulation layer (not shown). The well 110 is formed within the substrate 100. The two drift regions 120a/120b are formed within the well 110. The source/drain regions 140a/140b are formed within the drift regions 120a/120b, respectively. The channel region 130 is formed between the source region 140a and the drain region 140b. The gate 150 is formed over the substrate 100 and the gate insulation layer is formed between the gate 150 and the substrate 100. In general, the width of the device is determined by the width W4 of the source region 140a and the drain region 140b. In FIG. 1, the width W1 of the gate 150 in the high voltage device is greater than the width W2 of the drift regions 120a/120b as well as the width W3 of the channel region 130. One major disadvantage for this layout is that when the width of the device is smaller, charges in the source region 140a can easily flow from the drift region 120a along the edge of the gate 150 into the drift region 120b, leading to unnecessary current leakage.

FIG. 2 is a top view of another conventional high voltage metal-oxide-semiconductor (MOS) transistor. Compared with FIG. 1, the width W3' of the channel region 230 of the high voltage MOS transistor in FIG. 2 is reduced. In other words, the width W3' of the channel region 230 is smaller than the width W2 of the drift regions 120a/120b. However, one major problem for this layout is that the sub-threshold current will increase following a reduced dimension of the device.

SUMMARY OF THE INVENTION

Accordingly, one objective of the present invention is to provide a high voltage metal-oxide-semiconductor (MOS) transistor and fabricating method thereof capable of avoiding the leakage current and lowering the sub-threshold current of the MOS device.

To achieve these and other advantages and in accordance with the purpose of the invention, as embodied and broadly described herein, the invention provides a high voltage MOS transistor. The high voltage MOS transistor comprises a substrate, a well, an insulation layer, a gate, two drift regions, a channel region, a source/drain region and an isolation structure. The well is disposed in the substrate and the gate insulation layer is disposed on the substrate. The gate is disposed on the gate insulation layer. The two drift regions are disposed in the well region beside the gate. The width of the gate is smaller than or equal to that of the drift regions. The channel region is disposed between the drift regions. The width of the channel region is greater than that of the drift regions. The source/drain regions are disposed in the two drift regions, respectively. The isolation structure is disposed inside the drift regions. The isolation structure is located between the source/drain region and the channel region and the two drift regions enclose the source/drain regions and the isolation structure.

In one embodiment of the present invention, the width of the gate of the high voltage MOS transistor is greater than or at least equal to that of the source/drain region.

In one embodiment of the present invention, the channel region of the high voltage MOS transistor does not extend beyond the well.

In one embodiment of the present invention, the well and the channel region of the high voltage MOS transistor are n-doped regions and the drift regions and the source/drain regions of the high voltage MOS transistor are p-doped regions.

In one embodiment of the present invention, the well and the channel region of the high voltage MOS transistor are p-doped regions and the drift regions and the source/drain regions of the high voltage MOS transistor are n-doped regions.

In one embodiment of the present invention, the isolation structure comprises a shallow trench isolation (STI) structure or a field oxide layer.

The present invention also provides a method of fabricating a high voltage metal-oxide-semiconductor (MOS) transistor. First, a substrate is provided. A well is formed in the substrate and then two drift regions are formed inside the well. Thereafter, a channel region is formed between the drift regions. The width of the channel region is greater than that of the drift regions. After that, a source/drain region is formed inside the two drift regions, respectively. Then, an isolation structure is formed inside the drift regions between the source/drain region and the channel region. A gate insulation layer is formed over the substrate and then a gate is formed over the gate insulation layer. The width of the gate is smaller than or equal to that of the drift regions.

In one embodiment of the present invention, the width of the gate of the high voltage MOS transistor is greater than or at least equal to that of the source/drain region.

In one embodiment of the present invention, the channel region of the high voltage MOS transistor does not extend beyond the well.

In one embodiment of the present invention, the well and the channel region of the high voltage MOS transistor are n-doped regions and the drift regions and the source/drain regions of the high voltage MOS transistor are p-doped regions.

In one embodiment of the present invention, the well and the channel region of the high voltage MOS transistor are p-doped regions and the drift regions and the source/drain regions of the high voltage MOS transistor are n-doped regions.

In one embodiment of the present invention, the method of fabricating the isolation structure comprises performing a shallow trench isolation (STI) process or a field oxidation process.

In one embodiment of the present invention, the method of forming the two drift regions comprises performing an ion implantation process.

In one embodiment of the present invention, the method of forming the channel region comprises performing an ion implantation process.

In one embodiment of the present invention, the method of forming the source/drain regions comprises performing an ion implantation process.

In the present invention, the width of the gate of the high voltage MOS transistor is smaller than or at most equal to that of the drift regions and the width of the channel region is greater than that the drift regions. Hence, the leakage current flowing from the edge of the gate can be reduced and the sub-threshold voltage resulted from a short channel width can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
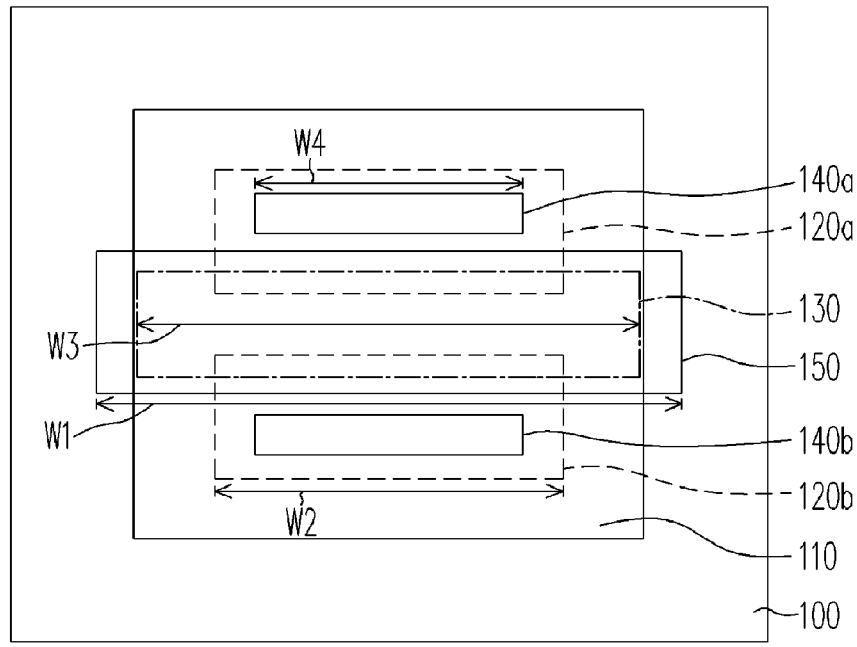
FIG. 1 is a top view of a conventional high voltage metal-oxide-semiconductor (MOS) transistor.
Figure 2:
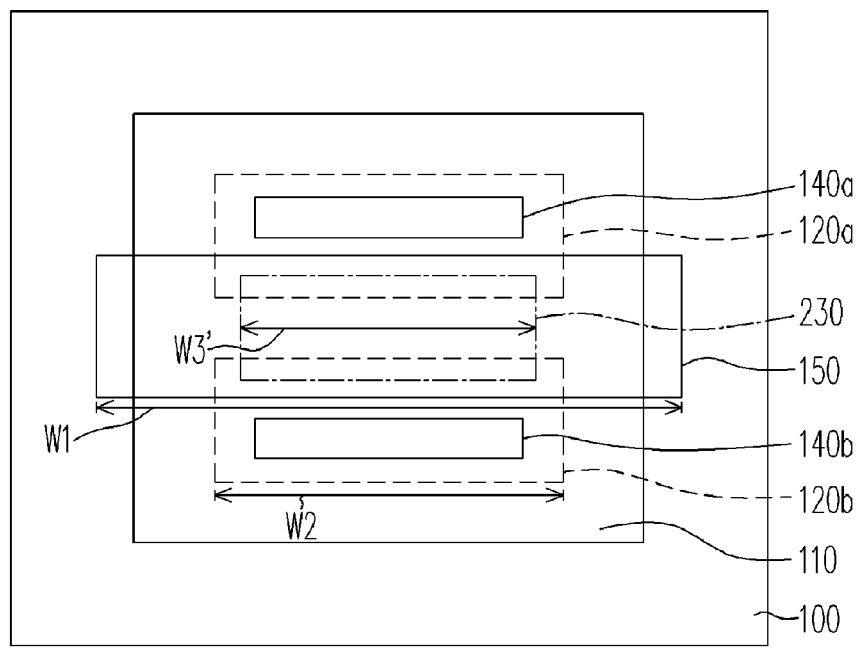
FIG. 2 is a top view of another conventional high voltage metal-oxide-semiconductor (MOS) transistor.

Reference will now be made in detail to the present embodiments of the invention, examples of which are illustrated in the accompanying drawings. Wherever possible, the same reference numbers are used in the drawings and the description to refer to the same or like parts.

Figure 3:
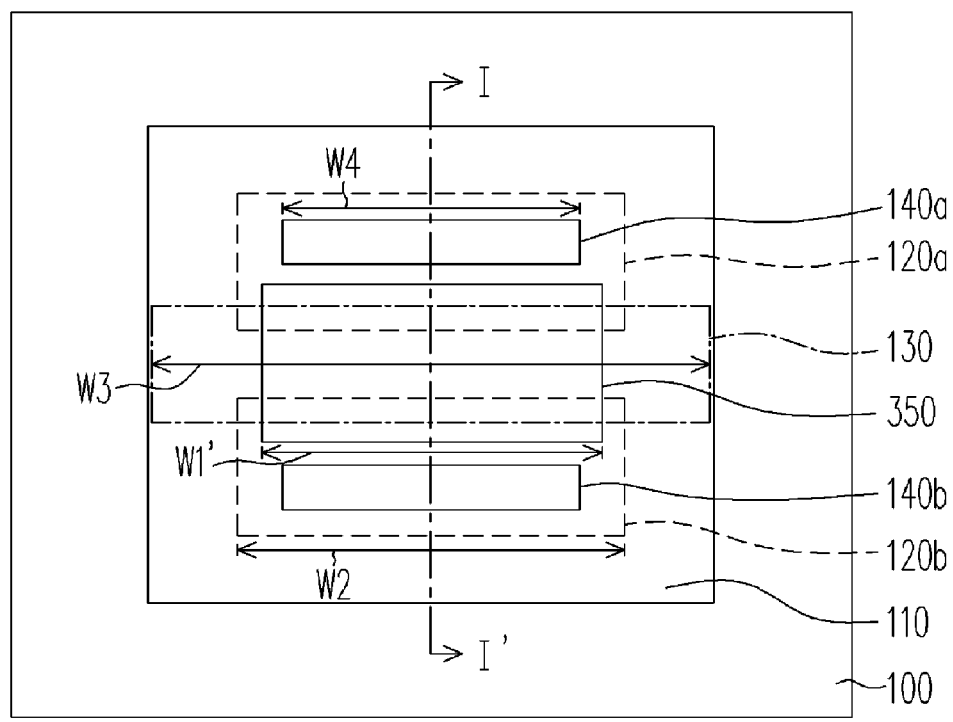
FIG. 3 is a top view of a high voltage metal-oxide-semiconductor (MOS transistor according to one embodiment of the present invention.
Figure 4:
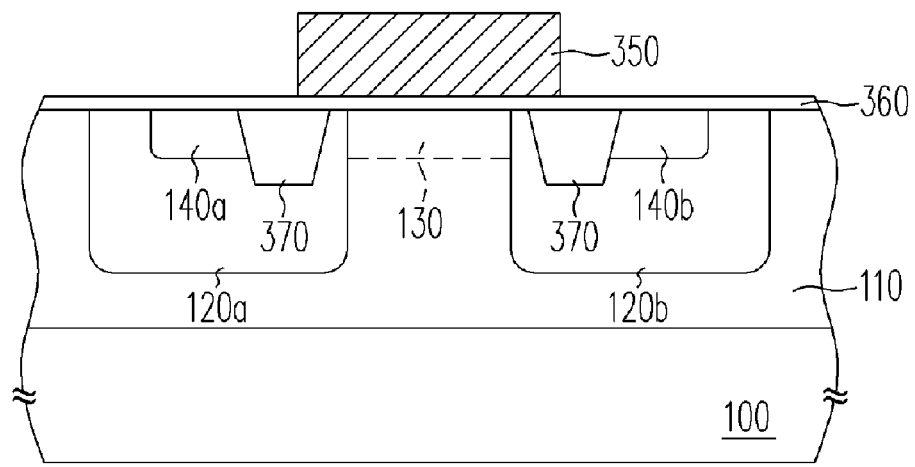
FIG. 4 is a schematic cross-sectional view along line I-I' of the high voltage MOS transistor in FIG. 3.

FIG. 3 is a top view of a high voltage metal-oxide-semiconductor (MOS transistor according to one embodiment of the present invention. FIG. 4 is a schematic cross-sectional view along line I-I' of the high voltage MOS transistor in FIG. 3. As shown in FIGS. 3 and 4, the high voltage MOS transistor of the present invention comprises a substrate 100, a well 110, two drift regions 120a/120b, a channel region 130, a source/drain region 140a/140b, an isolation structure 370, a gate insulation layer 360 and a gate 350. The well 110 is disposed in the substrate 100. The gate insulation layer 360, made of silicon oxide, for example, is disposed over the substrate 100. The gate 350, made of doped polysilicon, for example, is disposed on the gate insulation layer 360.

The two drift regions 120a/120b are disposed within the well 110 at two sides of the gate 350. The width of the gate 350 W1' is smaller than or at most equal to the width W2 of the drift regions 120a/120b.

The channel region 130 is disposed between the drift regions 120a/120b. The width of the channel region 130 W3 is greater than the width W2 of the drift regions 120a/120b. In one embodiment, the channel region 130 does not extend beyond the well 110.

The source/drain regions 140a/140b are disposed within the drift regions 120a/120b, respectively. In one embodiment, the width W1' of the gate 350 is greater than or at least equal to the width W4 of the source/drain region 140a/140b.

The isolation structure 370 is disposed inside two drift regions 120a/120b, and between the source/drain region 140a/140b and the channel region 130. The two drift regions 120a/120b enclose the source/drain regions 140a/140b and the isolation structures 370, respectively. In one embodiment, the isolation structures 370 are shallow trench isolation (STI) structures, for example. In another embodiment, the isolation structures 370 are field oxide layers, for example.

If the aforementioned high voltage MOS transistor is a p-type transistor, the well 110 and the channel region 130 are n-doped regions while the drift regions 120a/120b and the source/drain regions 140a/140b are p-doped regions. On the other hand, if the aforementioned high voltage MOS transistor is an n-type transistor, the well 110 and the channel region 130 are p-doped regions while the drift regions 120a/120b and the source/drain regions 140a/140b are n-doped regions.

According to the embodiment of the present invention, the high voltage MOS transistor has a gate 350 with a width W1' smaller than or at most equal to the width W2 of the drift regions 120a/120b. Accordingly, charges are prevented from flowing from the drift region 120a along the edge of the gate 350 to the drift region 120b, which leads to unnecessary current leakage. Furthermore, with the channel region 130 having a width W3 greater than the width W2 of the drift regions 120a/120b, the sub-threshold current generated as a result of a narrow width W2 of the channel region 130 can be avoided.

The method of fabricating the high voltage MOS transistor comprises the following steps. First, as shown in FIGS. 3 and 4, a substrate 100 is provided. Next, a well 110 is formed in the substrate 100, by performing an ion implantation process, for example, to implant n-type or p-type dopants in the substrate 100. Thereafter, two drift regions 120a/120b are formed within the well 110, by performing an ion implantation process, for example, to implant p-type or n-type dopants into the well 110. Next, a channel region 130 is formed between the drift regions 120a/120b by performing an ion implantation process, for example, to implant p-type or n-type dopants into the well 110. The width of the channel region 130 W3 is greater than the width W2 of the drift regions 120a/120b. In one embodiment, the channel region 130 does not extend beyond the well 110. After that, a source/drain region 140a/140b is formed inside the drift regions 120a/120b, respectively by performing an ion implantation process, for example, to implant p-type or n-type dopants into the drift regions 120a/120b.

Thereafter, an isolation structure 370 is formed inside the drift regions 120a/120b. The isolation structure 370 is formed between the source/drain region 140a/140b and the channel region 130. In one embodiment, the isolation structures 370 are shallow trench isolation (STI) structures formed, for example, by performing a shallow trench isolation process. In another embodiment, the isolation structures 370 are field oxide layers formed, for example, by performing a local oxidation process.

Next, a gate insulation layer 360 is formed over the substrate 100. The gate insulation layer 360 can be made of silicon oxide layer, the layer being formed, for example, by performing a thermal oxidation process. Thereafter, a gate 350 is formed over the gate insulation layer 360 to form a transistor. In one embodiment, the gate 350 is formed, for example, by depositing a conductive material over the gate insulation layer 360 to form a gate conductive layer (not shown) and then performing a photolithographic and etching process. The width of the gate 350 W1' is smaller than or at most equal to the width W2 of the drift regions 120a/120b. In one embodiment, the width of the gate 350 W1' is greater than or at least equal to the width W4 of the source/drain region 140a/140b.

afterwards, subsequent process for fabricating the semiconductor device follows, including the fabrication of interconnects. For example, a dielectric layer (not shown) is formed over the substrate 100 and then contacts (not shown) are formed in the dielectric layer to electrically connect the source/drain regions 120a/120b and the gate 350 with conductive lines (not shown).

In summary, major advantages of the high voltage MOS transistor and fabrication method thereof according to the present invention include the following.

1. The width of the gate is smaller than or at most equal to the width of the drift region. Hence, charges in the source region are prevented from leaking via the edge of the gate.

2. The width of the channel region is greater than the width of the drift regions. Hence, the sub-threshold current generated due to a narrow width of the channel region can be avoided.

3. The present method of fabricating the high voltage MOS transistor does not require additional process. Hence, the present invention does not complicate the manufacturing process and can overcome problems associated with minimized high voltage MOS transistors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high voltage metal-oxide-semiconductor (MOS) transistor, comprising:
   a substrate;
   a well disposed in the substrate;
   a gate insulation layer disposed on the substrate;
   a gate disposed on the gate insulation layer;
   two drift regions disposed in the well at two sides of the gate, respectively, wherein the width of the gate is smaller than or at most equal to that of the drift regions;
   a channel region disposed between the drift regions, wherein the width of the channel region is greater than that of the drift regions;
   a source/drain region disposed inside the drift regions, respectively; and
   an isolation structure disposed inside the drift regions, respectively, wherein the isolation structure is located between the source/drain region and the channel region, the two drift regions enclose the source/drain region and the isolation structure, and the width of the source/drain region is smaller than or at least equal to that of the gate.

2. The MOS transistor of claim 1, wherein the channel region does not extend beyond the well.

3. The MOS transistor of claim 1, wherein the well and the channel region are n-doped regions and the drift regions and the source/drain regions are p-doped regions.

4. The MOS transistor of claim 1, wherein the well and the channel region are p-doped regions and the drift regions and the source/drain regions are n-doped regions.

5. The MOS transistor of claim 1, wherein the isolation structures comprise shallow trench isolation (STI) structures.

6. The MOS transistor of claim 1, wherein the isolation structures comprise field oxide layers.

7. A method of fabricating a high voltage metal-oxide-semiconductor (MOS) transistor, the method comprising:
   providing a substrate;
   forming a well in the substrate;
   forming two drift regions within the well;
   forming a channel region between the drift regions, wherein the width of the channel region is greater than that of the drift regions;
   forming a source/drain region in the drift regions, respectively;
   forming an isolation structure within the drift regions, respectively, and between the source/drain region and the channel region;
   forming a gate insulation layer over the substrate; and
   forming a gate over the gate insulation layer, wherein the width of the gate is smaller than or at most equal to that of the drift regions, and the width of the source/drain region is smaller than or at least equal to that of the gate.

8. The method of claim 7, wherein the channel region does not extend beyond the well.

9. The method of claim 7, wherein the well and the channel region are n-doped regions and the drift regions and the source/drain regions are p-doped regions.

10. The method of claim 7, wherein the well and the channel region are P-doped regions and the drift regions and the source/drain regions are n-doped regions.

11. The method of claim 7, wherein the method of forming isolation structures comprises performing a shallow trench isolation (STI) process.

12. The method of claim 7, wherein the method of forming isolation structures comprises performing a local oxidation process.

13. The method of claim 7, wherein the method of forming drift regions comprises performing an ion implantation process.

14. The method of claim 7, wherein the method of forming a channel region comprises performing an ion implantation process.

15. The method of claim 7, wherein method of forming the source/drain regions comprises performing an ion implantation process.

* * * * *